United States Patent
Hashimoto

(10) Patent No.: US 7,519,897 B2
(45) Date of Patent: Apr. 14, 2009

(54) DECODING APPARATUS AND DECODING METHOD

(75) Inventor: Takeshi Hashimoto, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 583 days.

(21) Appl. No.: 11/236,502

(22) Filed: Sep. 28, 2005

(65) Prior Publication Data
US 2006/0085729 A1     Apr. 20, 2006

(30) Foreign Application Priority Data
Sep. 29, 2004   (JP)   ............... 2004-283457

(51) Int. Cl.
*H03M 13/03* (2006.01)

(52) U.S. Cl. ............. 714/794; 714/795; 714/796; 714/792; 375/262; 375/341; 702/9; 369/59.22

(58) Field of Classification Search ......... 714/792–796; 375/262, 341, 265; 702/9; 369/59.22
See application file for complete search history.

(56) References Cited

U.S. PATENT DOCUMENTS

| 6,647,530 | B1 * | 11/2003 | Kamada ............... 714/792 |
| 6,850,573 | B1 * | 2/2005 | Noda ................. 375/262 |
| 7,127,664 | B2 * | 10/2006 | Nicol et al. ........... 714/792 |
| 2002/0136332 | A1 * | 9/2002 | Dielissen et al. ....... 375/341 |
| 2003/0014456 | A1 | 1/2003 | Nagata et al. |
| 2004/0054958 | A1 * | 3/2004 | Ikekawa .............. 714/795 |
| 2004/0091067 | A1 | 5/2004 | Ammer et al. |

FOREIGN PATENT DOCUMENTS

| EP | 1 387 516 A1 | 2/2004 |
| GB | 2 389 020 A | 11/2003 |
| KR | 1999-26452 | 4/1999 |

OTHER PUBLICATIONS

Korean Office Action dated Oct. 25, 2006, with partial English translation.
3GPP (3rd Generation Partnership Project; Technical Specification Group Radio Access Network; Multiplexing and channel coding (FDD), 1999, TS 25.212, V3.9.0, (Mar. 2002).
United Kingdom Search Report dated Dec. 13, 2005.

* cited by examiner

*Primary Examiner*—Guy J Lamarre
(74) *Attorney, Agent, or Firm*—McGinn IP Law Group, PLLC

(57) ABSTRACT

To provide a decoder and decoding method capable of reducing the number of times received data is decoded. A decoder according to the present invention includes: a Viterbi decoder decoding received data; a decode data length storage area storing a decode data length; a decoded data temporary storage area storing temporary storage data as decoded data up to a decode data length; a maximum data storage memory storing maximum decoded data as decoded data up to a maximum data length; a maximum-likelihood detection circuit selecting a decode data length based on likelihood information; and a decoded data reconstruction circuit replacing a part of maximum decoded data with temporary decoded data.

6 Claims, 7 Drawing Sheets

DECODING APPARATUS AND DECODING METHOD

BACKGROUND OF THE INVENTION

1. Field of the Invention

The present invention relates to a decoding apparatus and a decoding method, in particular, a decoding apparatus and decoding method for detecting a data format of received data.

2. Description of Related Art

In recent years, there have been made extensive studies on a communication method used for a mobile communication system such as a cellular phone. Under the 3rd generation partnership project (3GPP), the third-generation mobile communication system has been standardized, and the wideband code division multiple access (W-CDMA) method has been known as a communication method conforming to the 3GPP standards.

"3GPP (3rd Generation Partnership Project) TS (Technical Specification) 25.212, V.3.9.0" describes a format example of data transmitted and received in the W-CDMA based mobile communication system. According to the W-CDMA system, plural physical channels are multiplexed over a radio transmission path, and plural transport channels (hereinafter refereed to as "TrCHs") are multiplexed over each physical channel. These TrCHs enable simultaneous transmission/reception of various types of information such as audio data and image data among different channels, and enable communications with a transport quality adequate for corresponding services or the like.

FIG. 7 shows a data format example of TrCH transmitted over a physical channel in the W-CDMA system. Transmitted over the physical channel is composite combination TrCH (hereinafter referred to as "CCTrCH") data including plural TrCH data. In the illustrated example, the CCTrCH includes four TrCHs, i.e., TrCH#0, TrCH#1, TrCH#2, and TrCH#3. Further, each TrCH data is composed of data units of a specific data length. This data length is called a transport format (hereinafter referred to as "TF") In the illustrated example, 3 TFs (TF#0), 4 TFs (TF#3), 2 TFs (TF#1), and 4 TFs (TF#2) are assigned to the TrCH#0, TrCH#1, TrCH#2, and TrCH#3, respectively. Plural TFs in each TrCH may be different. For example, TF#0 is defined as a data size of 100 bits, TF#1 is defined as a data size of 120 bits, and TF#2 is defined as a data size of 150 bits. The format of the CCTrCH data is determined by a transport format combination (hereinafter referred to as "TFC"). That is, the TFC defines each TrCH and a combination of TFs in each TrCH.

Since a combination of TrCHs and TFs may vary among CCTrCH transmitted over a physical channel (that is, the TFC may be arbitrarily set), the receiver side needs to detect which TFC is used for the communication. This is because received data cannot be correctly decoded unless each TrCH is decoded using a proper data size.

"The 3GPP (3rd Generation Partnership Project) TS (Technical Specification) 25.212, V.3.9.0" describes several methods of detecting TFC. One of the TFC detecting methods utilizes a transport format combination indicator (hereinafter referred to as "TFCI"). The TFCI is information for identifying TFC of a CCTrCH. The method utilizing the TFCI transmits the TFCI together with CCTrCH over a physical channel. The receiver side decodes the TFCI before decoding the CCTrCH data to thereby detect the TFC of the CCTrCH. In addition, each TrCH in the CCTrCH is decoded based on the TrCH and TF information contained in the TFC, so accurate decoded data can be obtained.

To give another TFC detecting method, if no TFCI is transmitted over a physical channel, an explicit detectable TrCH is utilized in place of the TFCI. The explicit detectable TrCH, which is one of the TrCHs in the CCTrCH, serves as a reference for detecting TFC. When decoding CCTrCH, the receiver side first decodes the explicit detectable TrCH in the CCTrCH to thereby determine the TF of the explicit detectable TrCH. Then, the TF of the explicit detectable TrCH is used to detect the TFC, and each TrCH in the CCTrCH is decoded based on the TrCH and TF information in the detected TFC. Such a method of detecting TFC using an explicit detectable TrCH is called a blind transport format detection (hereinafter referred to as "BTFD").

FIGS. 8A and 8B show the data format of an explicit detectable TrCH based on BTFD and a decoding method therefor. As shown in FIG. 8A, the explicit detectable TrCH is composed of a data area, a cyclic redundancy check (CRC) area, and an empty area. The data area stores communication data such as audio data. The CRC area stores a CRC value for error detection for the data area. The empty area has empty data, i.e., a sequence of "0s". The entire size of the explicit detectable TrCH is equivalent to the maximum size of the TrCH; the TF spans the data area to the CRC area.

The explicit detectable TrCH data is coded through convolutional coding, and decoded through Viterbi decoding based on the Viterbi algorithm. The Viterbi decoding, which is a maximum-likelihood decoding method, decodes target data into a code of the maximum likelihood (most possible).

According to the Viterbi decoding, decoding is carried out based on a state transition diagram called a Trellis diagram. In the Trellis diagram, a path consisting of interconnected states at respective time points corresponds to a decoded code sequence to be obtained. The likelihood is computed for all possible paths, and the path of the maximum likelihood is defined as a survival path corresponding to a decoded data. Since one survival path cannot be selected at each time point, several survival paths are selected at each time point, and finally the past paths are narrowed down into one survival path. To elaborate, according to the Viterbi decoding, decoded data of n-th bit data is not yet determined at the time of decoding the nth-bit data, but is determined at a later time when m-th bit data subsequent to the n-th bit data is decoded.

The explicit detectable TrCH stores "0s" in the empty area, so this area contains only transmission noise. Therefore, assuming that the explicit detectable TrCH data is subjected to Viterbi decoding from the first bit on down, as shown in FIG. 8B, the maximum likelihood is obtained at a correct end of a TF. In FIG. 8, the likelihood is maximum at TF#0, so the TF#0 is highly likely to be a correct TF. Further, CRC calculation is made for decoded data in the TF#0. If the CRC calculation is correct, the TF#0 can be defined as a correct TF.

FIG. 9 is a flowchart showing a related decoding method. This method detects a TF as well as decodes explicit detectable TrCH data.

To begin with, a candidate for the minimum TF (decoding data length) is retrieved for determining a data area to be first decoded (S801). Next, the coded explicit detectable TrCH data is decoded from the first bit to the retrieved TF candidate (S802).

Subsequently, CRC calculation is made using the thus-decoded data (S803). Then, it is checked whether or not the CRC calculation result is OK (S804). If the CRC calculation result is NG, the next TF candidate is obtained (S805). Then, steps S802 and S803 are repeated. If the CRC calculation result is OK, likelihood information and size (decode data length) at this point are stored (S806).

Next, whether the explicit detectable TrCH data is decoded to the maximum size is decided (S807). If the explicit detectable TrCH data has not yet been decoded to the maximum size, the next TF candidate is acquired (S805). Then, steps S802 to S806 are repeated. If the explicit detectable TrCH data has already been decoded to the maximum size, a size of the maximum-likelihood is obtained and determined as a TF (S808).

Next, the explicit detectable TrCH data is decoded from the first bit to the determined TF again (S809). Finally, the TF of the explicit detectable TrCH and the decoded explicit detectable TrCH data are output (S810).

It has now been discovered that, according to the conventional decoding method, data is decoded up to the maximum size and then a TF is determined, after which the data should be decoded again. This is because, if the explicit detectable TrCH data is decoded up to the maximum size through Viterbi decoding, data smaller than the maximum size may not be correctly decoded. That is, as mentioned above, decoded data at each time point is fixed through subsequent decoding processes, according to the Viterbi decoding. Hence, if data is decoded up to the maximum size, the decoded data smaller than the maximum size is replaced by low-reliability data through subsequent decoding processes. In addition, when an additional decoding process is performed, a process time accordingly lengthens, and power consumption increases. Even if plural decoders are used to carry out decoding processes in parallel, circuit scale increases although the process time can be shortened.

As discussed so far, the above described decoding method has a problem that the decoding process should be repeated several times.

SUMMARY OF THE INVENTION

A decoder according to the present invention includes: a decoding section decoding received data based on likelihood information to generate decoded data; a decode data length storage section storing a plurality of decode data lengths; a temporary decoded data storage section storing a plurality of temporary decoded data each of which is data of a predetermined length taken from decoded data obtained by decoding the received data up to each of the plurality of decode data lengths; a maximum decoded data storage section storing maximum decoded data as decoded data obtained by decoding the received data up to a maximum data length; a selection section selecting one of the plurality of decode data lengths based on likelihood information; and a decoded data replacing section replacing a part of the maximum decoded data with one of the plurality of temporary decoded data based on the selected decode data length. According to the decoder of the present invention, a part of the decoded data of the predetermined decode data length is held. Based on this, after the received data is completely decoded, the decoded data is optionally replaced with the held data to thereby reconstruct the decoded data of the predetermined decode data length. Consequently, it is possible to reduce the number of times the received data is decoded.

A decoding method according to the present invention includes: decoding received data based on likelihood information to generate decoded data; storing a plurality of decode data lengths; storing a plurality of temporary decoded data each of which is data of a predetermined length taken from decoded data obtained by decoding the received data up to each of the plurality of decode data lengths; storing maximum decoded data which is decoded data obtained by decoding the received data to a maximum data length; selecting one of the plurality of decode data lengths based on likelihood information; and replacing a part of the maximum decoded data with one of the plurality of temporary decoded data based on the selected decode data length. According to the decoding method of the present invention, it is possible to reduce the number of times the received data is decoded.

According to the present invention, it is possible to provide a decoder and decoding method capable of reducing the number of times the received data is decoded.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment of the Invention

First of all, a description is given of a decoder and decoding method according to a first embodiment of the present invention. The decoder according to this embodiment has a feature that a part of half-decoded data is held to reconstruct decoded data using the held data as necessary.

Figure 1:
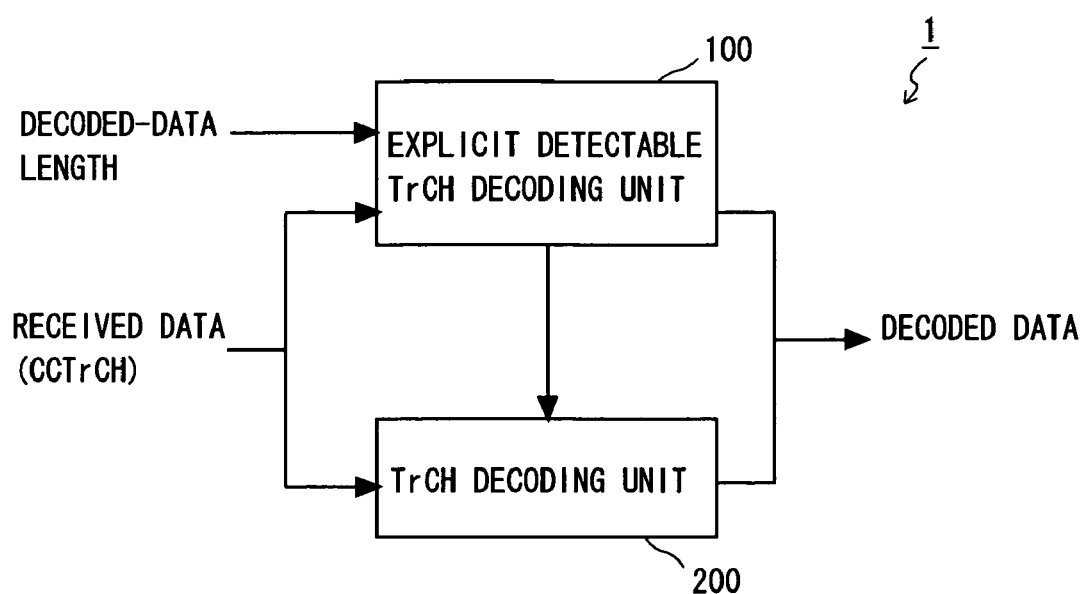
FIG. 1 is a block diagram showing the configuration of a decoder according to the present invention.

Referring now to FIG. 1, the configuration of the decoder according to this embodiment is described. A decoder 1 is used for a W-CDMA based mobile communication system conforming to 3GPP standards. The decoder 1 is provided to, for example, a receiving unit on the mobile terminal side or the base station side, and adapted to decode received data that is coded with a predetermined error correction code. In particular, the decoder 1 is intended for BTFD. If a TFCI is not transmitted over a physical channel, the decoder 1 detects a TFC in received data and decodes the received data based on the detected TFC instead of using the TFCI.

Figure 7:
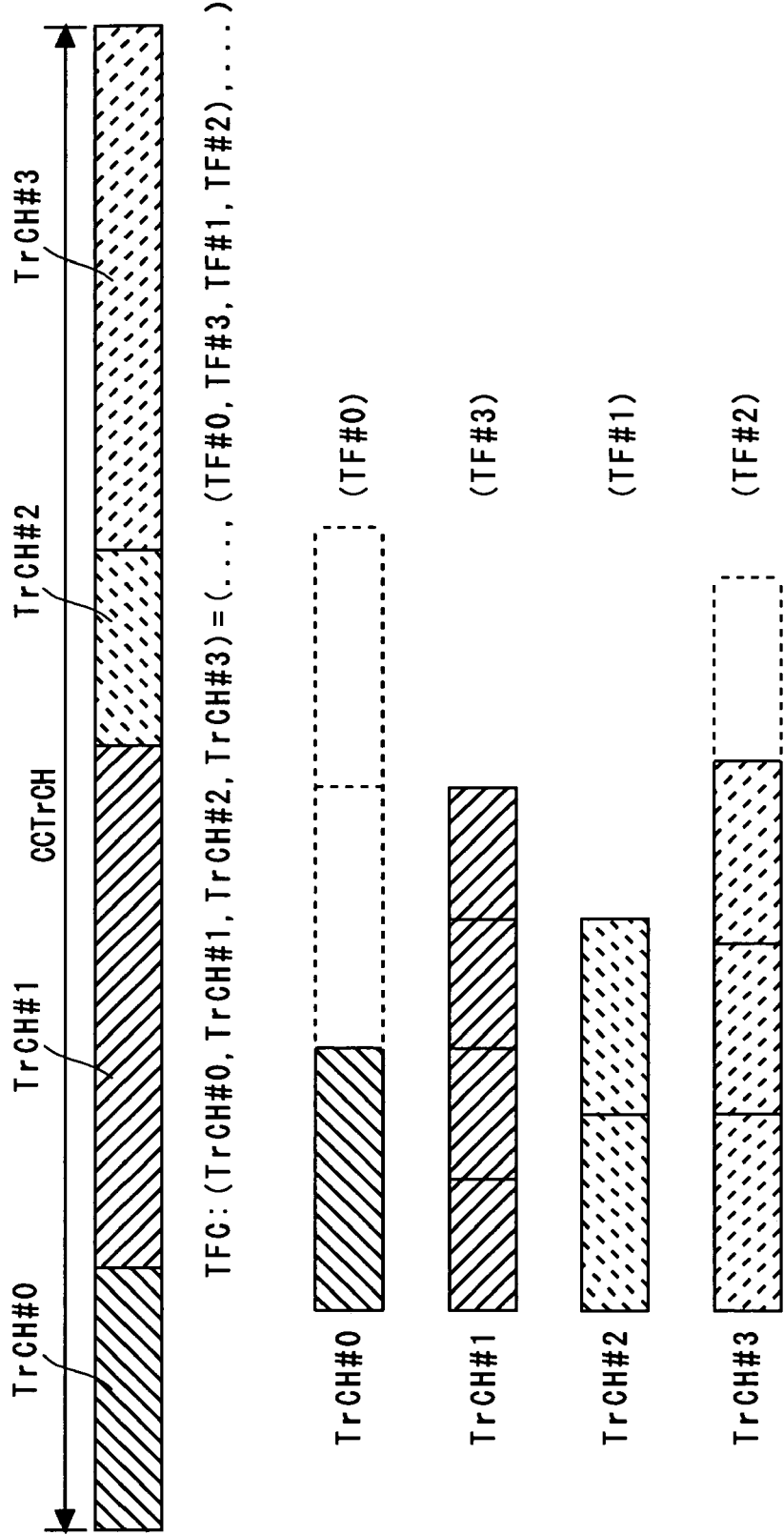
FIG. 7 shows a format of transport channel (TrCH) data.
Figures 8A, 8B:
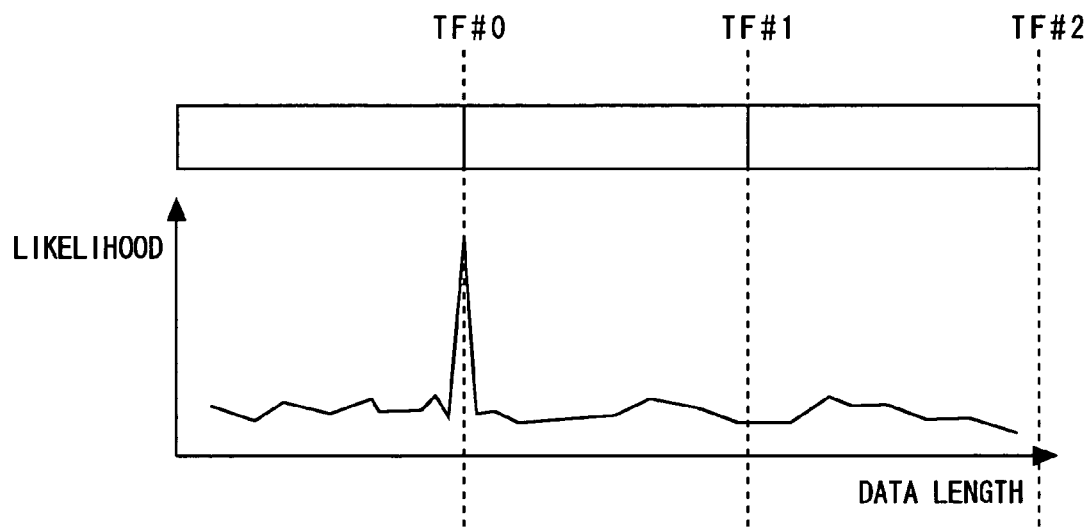
FIG. 8A and FIG. 8B show a format of explicit detectable TrCH data and a decoding method therefor.
Figure 9:
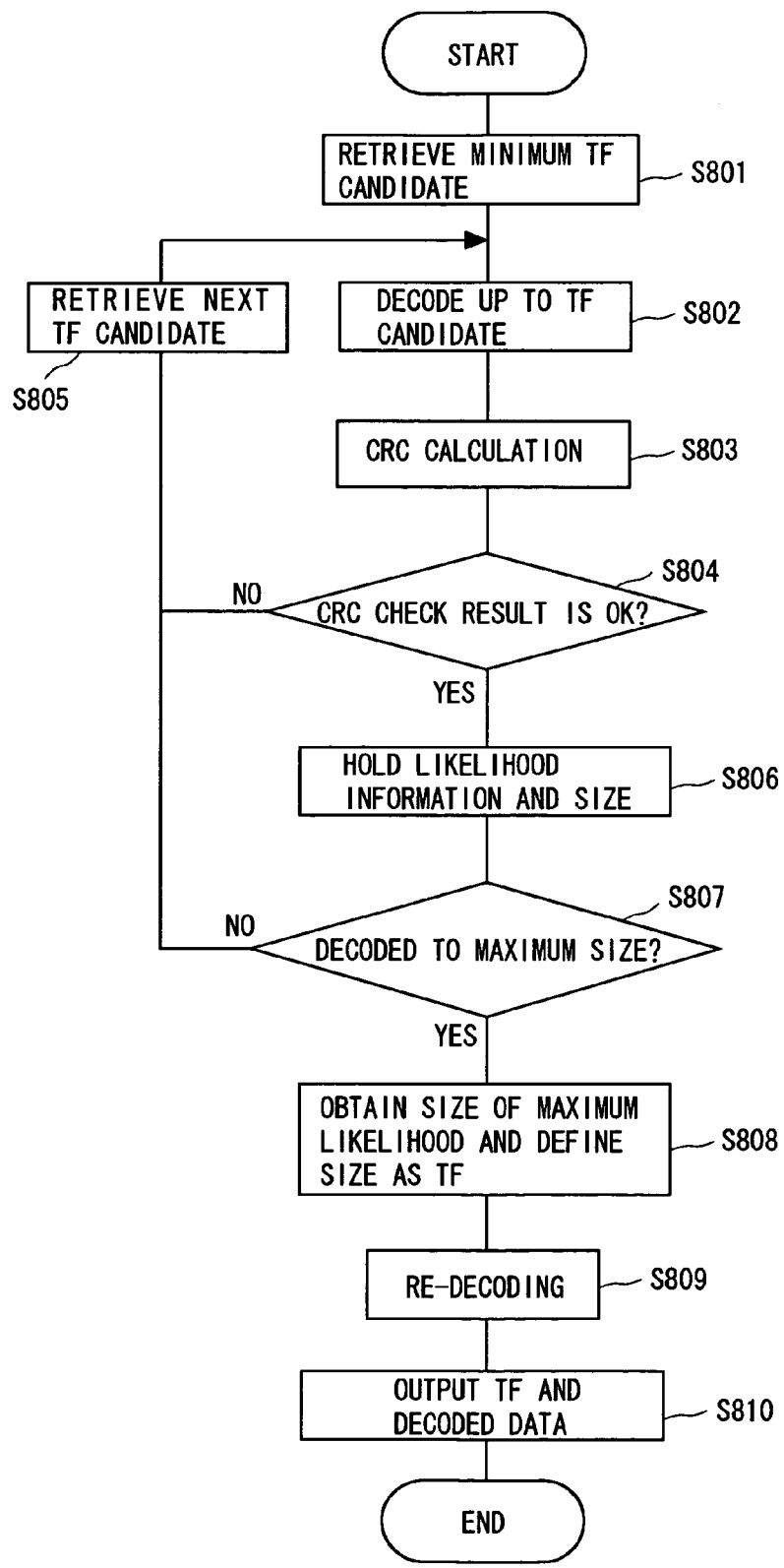
FIG. 9 is a flowchart showing a conventional decoding method.

The decoder 1 receives CCTrCH data transmitted over a physical channel as received data. This data conforms to, for example, a format as shown in FIG. 7. The received data is obtained by despreading a signal received through an antenna and then decoding it with quadrature phase shift keying (QPSK).

The decoder 1 includes, as shown in FIG. 1, an explicit detectable TrCH decoding unit 100 and a TrCH decoding unit 200. Herein, the explicit detectable TrCH decoding unit 100 and the TrCH decoding unit 200 are illustrated as different blocks; however, these units can share a part of function as necessary. For example, when the TrCH decoding unit 200 decodes convolutional-coded TrCH data, decoding may be carried out using a Viterbi decoder in the explicit detectable TrCH decoding unit 100.

The explicit detectable TrCH decoding unit 100 decodes explicit detectable TrCH data out of TrCH data in CCTrCH data. The explicit detectable TrCH decoding unit 100 receives the explicit detectable TrCH contained in the CCTrCH and decoding data lengths.

The decode data length indicates a size for decoding explicit detectable TrCH and the length corresponds to a TF in the explicit detectable TrCH. The explicit detectable TrCH decoding unit 100 receives plural decode data lengths and selects an appropriate decode data length (TF) for decoding an explicit detectable TrCH. The decode data length is defined by data previously acquired through a control channel.

The explicit detectable TrCH decoding unit 100 decodes the explicit detectable TrCH data based on the decode data length, and detects a TF as well. Then, the explicit detectable TrCH decoding unit 100 outputs the decoded data to the outside, and supplies the detected TF to the TrCH decoding unit 200. The TF is a value specifying a TFC of a CCTrCH, so the explicit detectable TrCH decoding unit 100 or TrCH decoding unit 200 determines the TFC of the CCTrCH by the TF. Therefore, the TFC specified by the TF may be supplied to the TrCH decoding unit 200, instead of the TF.

Note that the explicit detectable TrCH decoding unit 100 may select explicit detectable TrCH to be decoded from the CCTrCH based on any method. For example, control data previously acquired through the control channel may be used to specify a location of the explicit detectable TrCH and select the explicit detectable TrCH.

The TrCH decoding unit 200 decodes other TrCHs than the explicit detectable TrCH out of all the TrCHs in the CCTrCH. The TrCH decoding unit 200 decodes each TrCH in the CCTrCH, based on the TF or TFC supplied from the explicit detectable TrCH decoding unit 100. Then, the TrCH decoding unit 200 outputs the decoded data to the outside. The decoded data output from the explicit detectable TrCH decoding unit 100 and the TrCH decoding unit 200 are processed as communication data such as audio data in upper channels.

Figure 2:
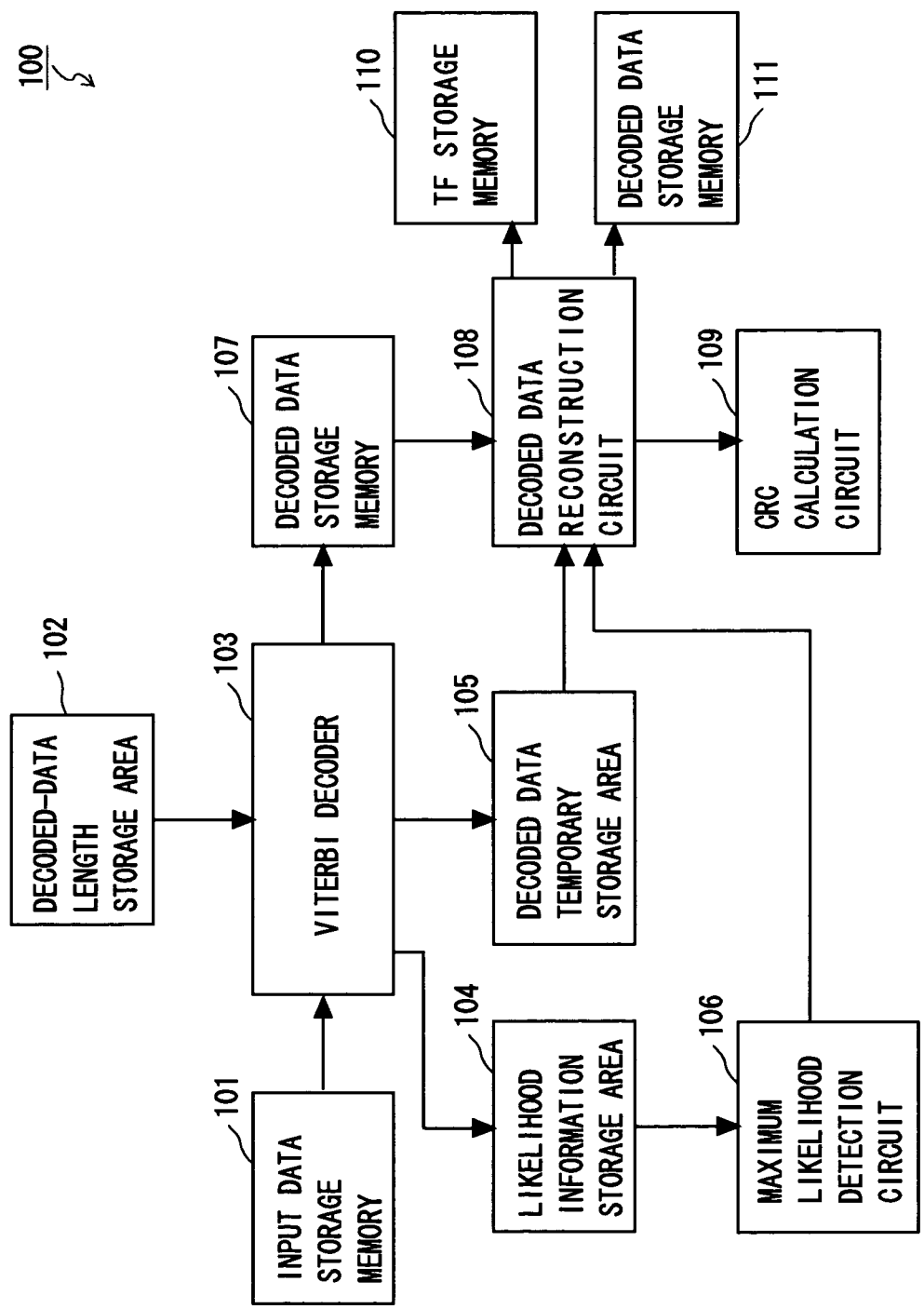
FIG. 2 is a block diagram showing the configuration of the decoder according to the present invention.

Referring next to FIG. 2, the configuration of the explicit detectable TrCH decoding unit according to this embodiment is described. The explicit detectable TrCH decoding unit 100 includes, as shown in FIG. 2, an input data storage memory 101, a decode data length storage area 102, a Viterbi decoder 103, a likelihood information storage area 104, a decoded data temporary storage area 105, a maximum-likelihood detection circuit 106, a decoded data storage memory 107, a decoded data reconstruction circuit 108, a CRC calculation circuit 109, a TF storage memory 110, and a decoded data storage memory 111.

The input data storage memory 101 is a memory (storage circuit) for storing received data as input data. The input data storage memory 101 receives data in the explicit detectable TrCH in the CCTrCH as received data. The explicit detectable TrCH decoding unit 100 outputs decoded data produced by decoding the received data with an appropriate decode data length.

The decode data length storage area 102 is a storage area (storage circuit) for storing plural decode data lengths as TF candidates. The decode data length storage area 102 stores N (for example, 16) decode data lengths. In this area, plural decoded lengths are prestored in ascending order, for example. To give an example thereof, the decode data lengths are stored as a data array of decode data lengths TFSZ [0] to TFSZ [N−1]. The explicit detectable TrCH decoding unit 100 detects and outputs an appropriate decode data length (TF) coinciding with one of those decode data lengths.

The Viterbi decoder 103 decodes (Viterbi-decodes) received data based on the Viterbi algorithm. The Viterbi decoder 103 reads received data of the explicit detectable TrCH from the input data storage memory 101, and decodes the received data from the first bit to the maximum size.

The explicit detectable TrCH as the received data is convolutionally coded and the constraint length is, for example, 9. Provided that the constraint length is 9, and the convolutionally coded data is decoded, 256 states appear in the Trellis diagram. The Viterbi decoder 103 performs decoding using likelihood information called pathmetrics in the 256 states and decoded-data candidates called path history.

The Viterbi algorithm temporally holds path histories of a decode data length, and provides, as a final decoding result, the decoded-data candidate of which the pathmetric shows the maximum likelihood. However, holding the path histories corresponding to the decode data length increases circuit scale. In this embodiment, the data length of a decoded-data candidate (path history length) is set shorter than the decode data length. When all decoded data candidates of the path history length are prepared, decoded data at the first point of the path history length is determined. The path history length is 4 to 5 times the constraint length, for example.

In data decoding, the Viterbi decoder 103 stores likelihood information (pathmetric) at each time when the data is decoded up to each decode data length stored in the decode data length storage area 102, in the likelihood information storage area 104. At the same time, the decoder selects the decoding result from the decoded data candidates and stores it in the decoded data temporary storage area 105.

The likelihood information storage area 104 is a storage area (storage circuit) for storing likelihood information supplied from the Viterbi decoder 103 at each decode data length. The likelihood information storage area 104 stores as many pieces of likelihood information as N data in the decode data length storage area 102. For example, the likelihood information are stored as a data array and stored respectively in positions corresponding to the decode data lengths TFSZ[0] to TFSZ[N−1] in the decode data length storage area 102. In addition, the decode data length and likelihood information are paired, and N pairs of data may be stored.

The decoded data temporary storage area 105 is a storage area (storage circuit) for holding temporary storage data (temporarily decoded data) which has a predetermined length and a partial data of decoded data obtained by decoding the received data up to the respective decode data lengths by the Viterbi decoder 103. The temporary storage data has a predetermined length backward (toward the top the decoded data, namely the first bit) from the end position of data decoded up to each decode data length. This predetermined length is, for example, a path history length. The preceding decoded data has been already determined and stored in the decoded data storage memory 107. The decoded data temporary storage area 105 stores as many temporary storage data as N data in the decode data length storage area 102. For example, the temporary storage data are stored as a data array in correspondence with the decode data lengths TFSZ[0] to TFSZ[N−1] in the decode data length storage area 102, similar to the likelihood information. Further, the decode data length and temporary storage data are paired, and N pairs of data may be stored.

The maximum-likelihood detection circuit 106 is not only a detection circuit for detecting a data length of the maximum likelihood from the likelihood information stored in the likelihood information storage area 104 but also a selection circuit for selecting a decode data length based on the likelihood information. The maximum-likelihood detection circuit 106 rearranges the likelihood information in the likelihood information storage area 104 in the order of descending likelihoods (in descending order) to detect the maximum likelihood and select the decode data length corresponding to the maximum likelihood.

The decoded data storage memory 107 is a memory (storage circuit) for storing a decoding result (decoded data) from the Viterbi decoder 103. The decoded data storage memory 107 stores the received data that is decoded up to the maximum size (maximum decoded data).

The decoded data reconstruction circuit 108 reconstructs the decoded data using data stored in the decoded data storage memory 107 and the decoded data temporary storage area 105, based on the decode data length supplied from the maximum-likelihood detection circuit 106. Namely, the decoded data reconstruction circuit 108 replaces a part of the decoded data in the decoded data storage memory 107 with temporary storage data in the decoded data temporary storage area 105.

For example, the decoded data reconstruction circuit 108 stores decoded data read sequentially from the decoded data storage memory 107, in the decoded data storage memory 111. When the decoded data having a size of "decode data length of the maximum-likelihood—path history length" is obtained, the decoded data reconstruction circuit 108 reads and stores the decoded data stored in the decoded data temporary storage area 105 to reconstruct the decoded data. The thus-reconstructed decoded data is output to the CRC calculation circuit 109. If the CRC calculation result is OK, the data length at this point is set as the TF and stored in the TF storage memory 110.

The CRC calculation circuit 109 carries out CRC calculation on the reconstructed decoded data. The CRC calculation circuit 109 carries out the CRC calculation and checks the calculation result against a CRC value of the decoded data.

The TF storage memory 110 is a memory (storage circuit) for storing the TF determined by the decoded data reconstruction circuit 108. The decoded data storage memory 111 is a memory (storage circuit) for storing final decoded data reconstructed as above. The TF stored in the TF storage memory 110 and decoded data stored in the decoded data storage memory 111 are output to the outside. Note that the TF storage memory 110 may be a processor memory and the processor may detect a TFC based on a TF.

Figure 3:
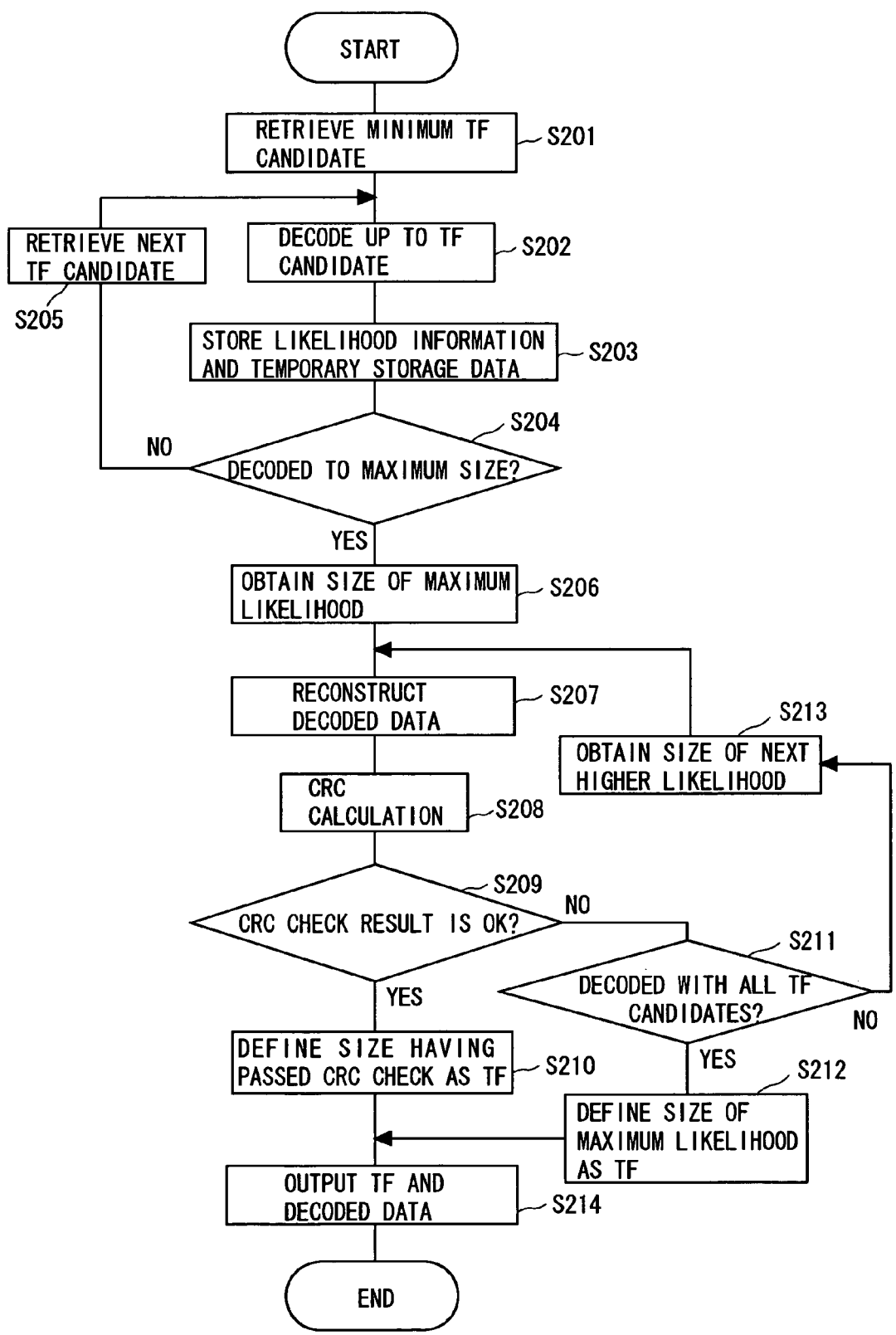
FIG. 3 is a flowchart showing a decoding method according to the present invention.

Referring next to FIGS. 3 to 6, a description is made of an operation of the explicit detectable TrCH decoding unit according to this embodiment. A flowchart of FIG. 3 illustrates how the explicit detectable TrCH decoding unit 100 decodes the explicit detectable TrCH data.

For example, the decode data length storage area 102 stores decode data lengths as TF candidates, and after the input data storage memory 101 stores the received data, the following process is carried out.

First, the minimum TF candidate (decode data length) is retrieved for determining an area to be first decoded (S201).

The Viterbi decoder 103 obtains the minimum decode data length from the decode data length storage area 102. If the decode data lengths are stored in ascending order, the top decode data length is obtained.

Next, the coded explicit detectable TrCH data is decoded from the first bit to the obtained TF candidate (S202). The Viterbi decoder 103 Viterbi-decodes the received data stored in the input data storage memory 101 from the first bit on down. Then, the Viterbi decoder 103 keeps decoding up to the decode data length obtained in step S201 or S205.

Figure 4:
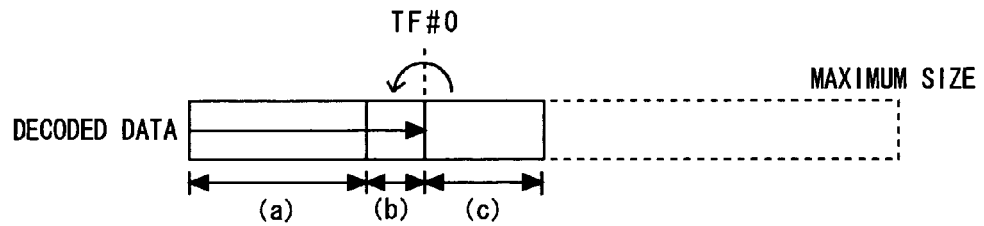
FIG. 4 illustrates the decoding method according to the present invention.

For example, as shown in FIG. 4, the Viterbi decoder 103 decodes the received data from the first bit toward the maximum size. In FIG. 4, portions (a), (b), and (c) show data that are under decoding process. An internal state (pathmetric or path history) is held for the data of the portion (c) during a decoding process. This data has a size corresponding to the path history length. The data of the portion (b) is such data as is decoded in accordance with the held internal state of the portion (c). The data area of the portion (a) is a fixed decoded-area. That is, the Viterbi decoder 103 decodes the data of the portion (b) based on the internal state of the portion (c) while keeping this internal state. The Viterbi decoder 103 stores the decoded data (of portion (a)) as a decoding result in the decoded data storage memory 107 while continuing to decode the data.

Next, the likelihood information and temporary storage data about the thus-decoded data are held (S203). The Viterbi decoder 103 stores the likelihood information about the decoded data in step S202 in the likelihood information storage area 104, and stores the temporary storage data in the decoded data temporary storage area 105. Both the data are stored in given areas associated with the corresponding decode data length in the likelihood information storage area 104 and the decoded data temporary storage area 105.

Here, the temporary storage data stored in the decoded data temporary storage area 105 is explained. For example, it is assumed that TF#0 in FIG. 4 is defined as an expected size, and a size derived by subtracting the expected size from the maximum size is assigned to an empty area. If decoding is performed on even the portion (c), the data of the portion (b) is affected by noise in the empty area, resulting in low-reliable decoded data. That is, if the correct TF is TF#0, the data decoded up to the TF#0 attains the highest reliability, and the data decoded beyond the TF#0 is low in reliability.

Figure 5:
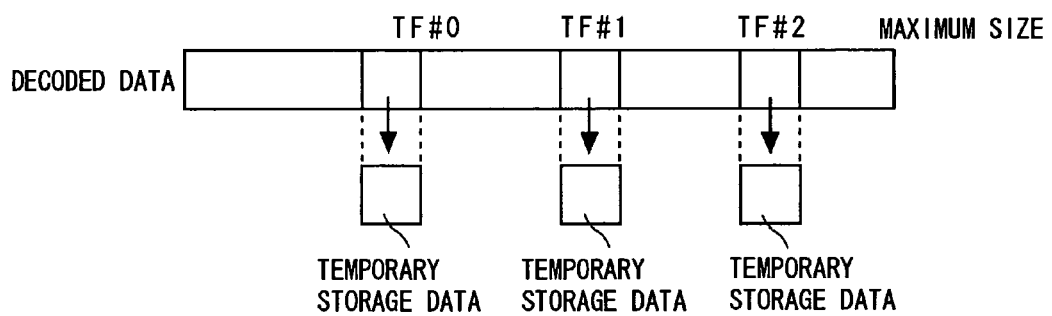
FIG. 5 illustrates the decoding method according to the present invention.

To overcome such a defect, in this embodiment, as shown in FIG. 5, a part of decoded data at each TF are held as temporary storage data during decoding. The size of the temporary storage data corresponds to a period during which an internal state is held, in other words, a path history length.

Next, it is decided whether or not the explicit detectable TrCH data has been decoded up to the maximum size (S204). The Viterbi decoder 103 determines whether or not the explicit detectable TrCH data is Viterbi-decoded up to the maximum size, that is, whether or not the received data remains to be decoded.

If it is determined that the data is not decoded up to the maximum size in step S204, the next TF candidate is acquired (S205) to repeat steps S202 and S203. When some of the received data remains undecoded, the Viterbi decoder 103 retrieves the next smaller TF candidate from the decode data length storage area 102, and decodes the data up to the retrieved TF candidate to store its likelihood information and temporary storage data.

If the received data is determined to be decoded up to the maximum size in step S204, the size of the maximum likelihood is obtained (S206). The Viterbi decoder 103 ends decoding if the received data is completely decoded. At this time, the decoded data storage memory 107 stores data decoded up to the maximum size. Upon the completion of the decoding process, the maximum-likelihood detection circuit 106 detects the maximum likelihood from the likelihood information stored in the likelihood information storage area 104 to find a decode data length corresponding to the detected maximum likelihood. For example, in the case where the likelihood information stored in the likelihood information storage area 104 are rearranged in descending order, the maximum-likelihood detection circuit 106 detects the top likelihood as the maximum likelihood.

Next, the decoded data is reconstructed (S207). The decoded data reconstruction circuit 108 reconstructs decoded data of the decode data length detected by the maximum-likelihood detection circuit 106. The reconstructed decoded data consists of decoded data having a size of "decode data length—path history length", and temporary storage data of the path history length.

Figure 6:
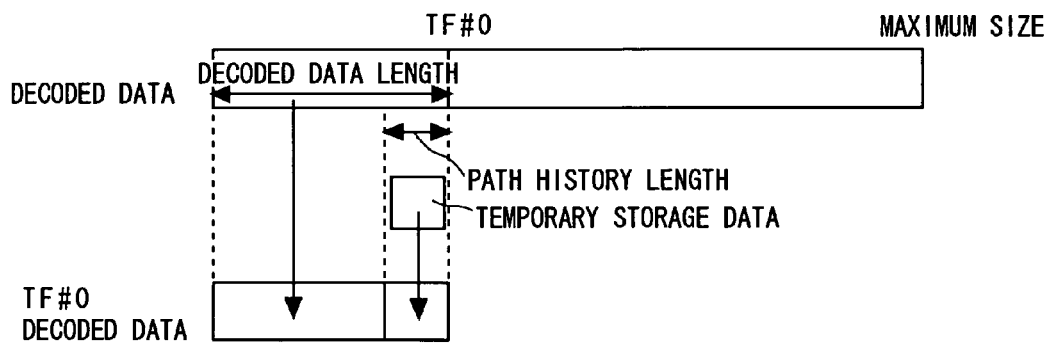
FIG. 6 illustrates the decoding method according to the present invention.

For example, the decoded data reconstruction circuit 108 reconstructs the decoded data as shown in FIG. 6. FIG. 6 shows an example of reconstructing the decoded data of TF#0. The decoded data reconstruction circuit 108 reads out the decoded data stored in the decoded data storage memory 107 from its first bit to the position of "decode data length—path history length", and combines the thus-read decoded data with temporary storage data stored in the decoded data temporary storage area 105 to thereby reconstruct the decoded data of TF#0.

Next, CRC calculation is made (S208). The CRC calculation circuit 109 performs CRC calculation on the decoded data thus reconstructed. For example, the CRC calculation circuit 109 performs CRC calculation on a data area in the decoded data.

Next, it is determined whether or not a CRC calculation result is OK (S209). The CRC calculation circuit 109 checks a CRC calculation result against a value of a CRC area in the thus-reconstructed decoded data. As a result, if the result matches the value, the calculation result is determined OK. Otherwise, the calculation result is determined NG.

When the CRC calculation result is determined OK in step S209, the data size at this time is defined as TF (S210). If the CRC calculation result from the CRC calculation circuit 109 is OK, the decoded data reconstruction circuit 108 sets the decode data length of the reconstructed decoded data as the TF.

If the CRC calculation result is determined NG in step S209, it is determined whether or not all the TF candidates are used for decoding (S211). If the CRC calculation result from the CRC calculation circuit 109 is NG, the decoded data reconstruction circuit 108 determines whether or not decoded data reconstruction and CRC calculation are carried out using all the decode data lengths prestored in the decode data length storage area 102.

If it is determined that the decoding is carried out using all the TF candidates in step S211, the size of the maximum likelihood is defined as TF (S212). If the decoded data reconstruction and CRC calculation are carried out using all the decode data lengths, the decoded data reconstruction circuit 108 sets the decode data length of the maximum likelihood as TF.

If it is determined that the decoding is not completed for all the TF candidates in step S211, the size of the next higher likelihood is obtained (S213) to repeat steps S207 and S208. If it is determined that the decoded data reconstruction and CRC calculation are not carried out for some decode data length, the decoded data reconstruction circuit 108 lets the maximum-likelihood detection circuit 106 detect the next higher likelihood to thereby obtain the decode data length corresponding to the detected likelihood. Then, the decoded data reconstruction and CRC calculation are performed based on the obtained decode data length.

Finally, the TF of the explicit detectable TrCH data and the decoded data of the explicit detectable TrCH data are output (S214). The decoded data reconstruction circuit 108 stores the TF defined in step S210 or S212, in the TF storage memory 110. The decoded data reconstructed with the TF is stored in the decoded data storage memory 111. Then, the stored TF and decoded data are output to the outside.

With this configuration, a part of the half-decoded data is stored, and the decoded data is reconstructed using the stored data, thereby reducing the number of decoding processes. A single decoding process suffices for the purpose, whereby it is possible to reduce the time necessary for detecting TF in the explicit detectable TrCH data and decoding the data. Since a single decoder suffices therefor, the circuit can be considerably downsized.

In addition, the shorter process time leads to less current consumption. That is, the TF detection and decoding are carried out without degrading the performance. In addition, only the data of the path history length is stored instead of storing all the decoded data of different decode data lengths. Consequently, highly-reliable decoding can be effected with a smaller memory capacity.

Other Embodiment of the Invention

Note that in the above examples, CRC calculation is made on the reconstructed, decoded data; however, the CRC calculation may be effected at any other time point. For example, the CRC calculation circuit 109 is configured to perform the CRC calculation on the data decoded by the Viterbi decoder 103. At the time when the data is decoded up to a TF candidate, a CRC value may be calculated to store the CRC calculation result together with the likelihood information and the temporary storage data. Then, after the data is decoded up to the maximum size, the decoded data reconstruction circuit 108 may reconstruct only decoded data of a size the CRC calculation result of which is determined OK. In this case, an additional area for storing the CRC calculation result is necessary, but any wasteful process for reconstructing decoded data can be eliminated.

In the above examples, the decoder is used for a W-CDMA based mobile communication system. However, the decoder is also applicable to a mobile communication system of another mode, and to other wired/wireless communication systems.

It is apparent that the present invention is not limited to the above embodiment that may be modified and changed without departing from the scope and spirit of the invention.

What is claimed is:

1. A decoding device, comprising:
an input data storage memory storing a received data to be decoded;
a viterbi decoder coupled to said input data storage memory to perform a viterbi decoding from a beginning time point of said received data until an end time point of said received data, and to output a first decoded data which is a result of said viterbi decoding of said received data from said beginning time point until said end time point,
wherein said viterbi decoder further outputs a second decoded data responsive to performing said viterbi decoding of a first time point of said received data, said first time point being after said beginning time point and before said end time point, said second decoded data being determined in accordance with a path metric regarding said received data;

a likelihood information storage coupled to said viterbi decoder to store said path metric;

a decoded data storage memory coupled to said viterbi decoder to store said first decoded data;

a decoded data temporary storage coupled to said viterbi decoder to store said second decoded data; and a decoded data reconstruction circuit coupled to said decoded data storage memory and said decoded data temporary storage, to output a third decoded data based on said first decoded data and said second decoded data.

2. The decoding device according to claim 1, wherein said second decoded data and a portion of said first decoded data corresponding to said second decoded data are different from each other.

3. The decoding device according to claim 1, wherein said decoded data reconstruction circuit combines a part of said first decoded data with said second decoded data to generate said third decoded data, said part of said first decoded data corresponding to said received data between said beginning time point and a second time point which is after said beginning time point and before said first time point.

4. The decoding device according to claim 3, wherein a period between said first time point and said second time point comprises a path history length.

5. The decoding device according to claim 1, wherein said viterbi decoder further outputs a fourth decoded data responsive to performing said viterbi decoding of a third time point of said received data, said third time point being after said first time point and before said end time point, said fourth decoded data being determined in accordance with said path metric, wherein said decoded data temporary storage further stores said third decoded data.

6. The decoding device according to claim 5, wherein said fourth decoded data and another portion of said first decoded data corresponding to said fourth decoded data are different from each other.

\* \* \* \* \*